US012567732B2

(12) United States Patent
Zou et al.

(10) Patent No.: US 12,567,732 B2
(45) Date of Patent: Mar. 3, 2026

(54) POWER CORD LEAKAGE DETECTION AND PROTECTION CIRCUIT

(71) Applicant: Zhongshan Kaper Electrical Co., Ltd, Guangdong (CN)

(72) Inventors: Bill Zou, Guangdong (CN); Xingjin Yu, Guangdong (CN); Xiannan Li, Guangdong (CN)

(73) Assignee: ZHONGSHAN KAPER ELECTRICAL CO., LTD, Guangdong (CN)

( * ) Notice: Subject to any disclaimer, the term of this patent is extended or adjusted under 35 U.S.C. 154(b) by 782 days.

(21) Appl. No.: 17/798,375

(22) PCT Filed: Mar. 22, 2022

(86) PCT No.: PCT/CN2022/082263
§ 371 (c)(1),
(2) Date: Sep. 21, 2023

(87) PCT Pub. No.: WO2023/173454
PCT Pub. Date: Sep. 21, 2023

(65) Prior Publication Data
US 2024/0063631 A1    Feb. 22, 2024

(30) Foreign Application Priority Data
Mar. 14, 2022    (CN) .......................... 202210245732.1

(51) Int. Cl.
H02H 5/10          (2006.01)
G01R 31/52         (2020.01)
(Continued)

(52) U.S. Cl.
CPC .............. H02H 5/10 (2013.01); G01R 31/52 (2020.01); G01R 31/58 (2020.01); H02H 3/04 (2013.01)

(58) Field of Classification Search
CPC . H02H 5/10; H02H 3/04; G01R 31/58; G01R 31/52
See application file for complete search history.

(56) References Cited

U.S. PATENT DOCUMENTS 7,751,161 B2 * 7/2010 Williams ................. H02H 5/10
                                                              361/45
11,049,632 B2 * 6/2021 Aromin .................. H01B 1/023
(Continued)

FOREIGN PATENT DOCUMENTS

CN          200950533 Y      9/2007
CN          101138139 A      3/2008
(Continued)

OTHER PUBLICATIONS

Stack Exchange article on octocoupler circuit design (Year: 2019).*
(Continued)

*Primary Examiner* — Danny Nguyen
*Assistant Examiner* — Samantha L Faubert
(74) *Attorney, Agent, or Firm* — MUNCY, GEISSLER, OLDS & LOWE, P.C.

(57) ABSTRACT

The invention discloses a power cord leakage detection and protection circuit, comprising a live wire, a neutral wire and a tripping coil, wherein a controlled switch controlled by the tripping coil is respectively provided on the live wire and the neutral wire; a shielded wire is respectively provided outside the live wire and the neutral wire; tail ends of the two shielded wires are connected; a shielded wire detection circuit respectively connected to head ends of the two shielded wires is provided between the live wire and the neutral wire for detecting whether the shielded wire is cracked; and the shielded wire detection circuit is connected with a control circuit for controlling the tripping coil to disconnect the controlled switch when the shielded wire is detected to be cracked, preventing the wire core from being
(Continued)

exposed after the shielded wire is broken and the short-circuiting between the live wire and the neutral wire to cause a fire accident.

6 Claims, 1 Drawing Sheet

(51) Int. Cl.
*G01R 31/58* (2020.01)
*H02H 3/04* (2006.01)

(56) References Cited

U.S. PATENT DOCUMENTS

| | | | | | |
|---|---|---|---|---|---|
| 11,243,265 | B2 * | 2/2022 | Li | ............................ | H02H 7/22 |
| 2007/0146946 | A1 | 6/2007 | Chen et al. | | |
| 2012/0075756 | A1 * | 3/2012 | Yu | ............................ | H02H 3/32 |
| | | | | | 361/42 |

FOREIGN PATENT DOCUMENTS

| | | | | |
|---|---|---|---|---|
| CN | 101615808 | A | | 12/2009 |
| CN | 102340124 | A | | 2/2012 |
| CN | 204928073 | U | | 12/2015 |
| CN | 205544207 | U | | 8/2016 |
| CN | 110648884 | A | * | 1/2020 |
| CN | 212908971 | U | | 4/2021 |
| CN | 217115614 | U | | 8/2022 |

OTHER PUBLICATIONS

International Search Report mailed Nov. 28, 2022 in PCT/CN2022/082263, 9 pages (w/English-language translation).
Written Opinion mailed Nov. 28, 2022 in PCT/CN2022/082263, 6 pages (w/English-language translation).

* cited by examiner

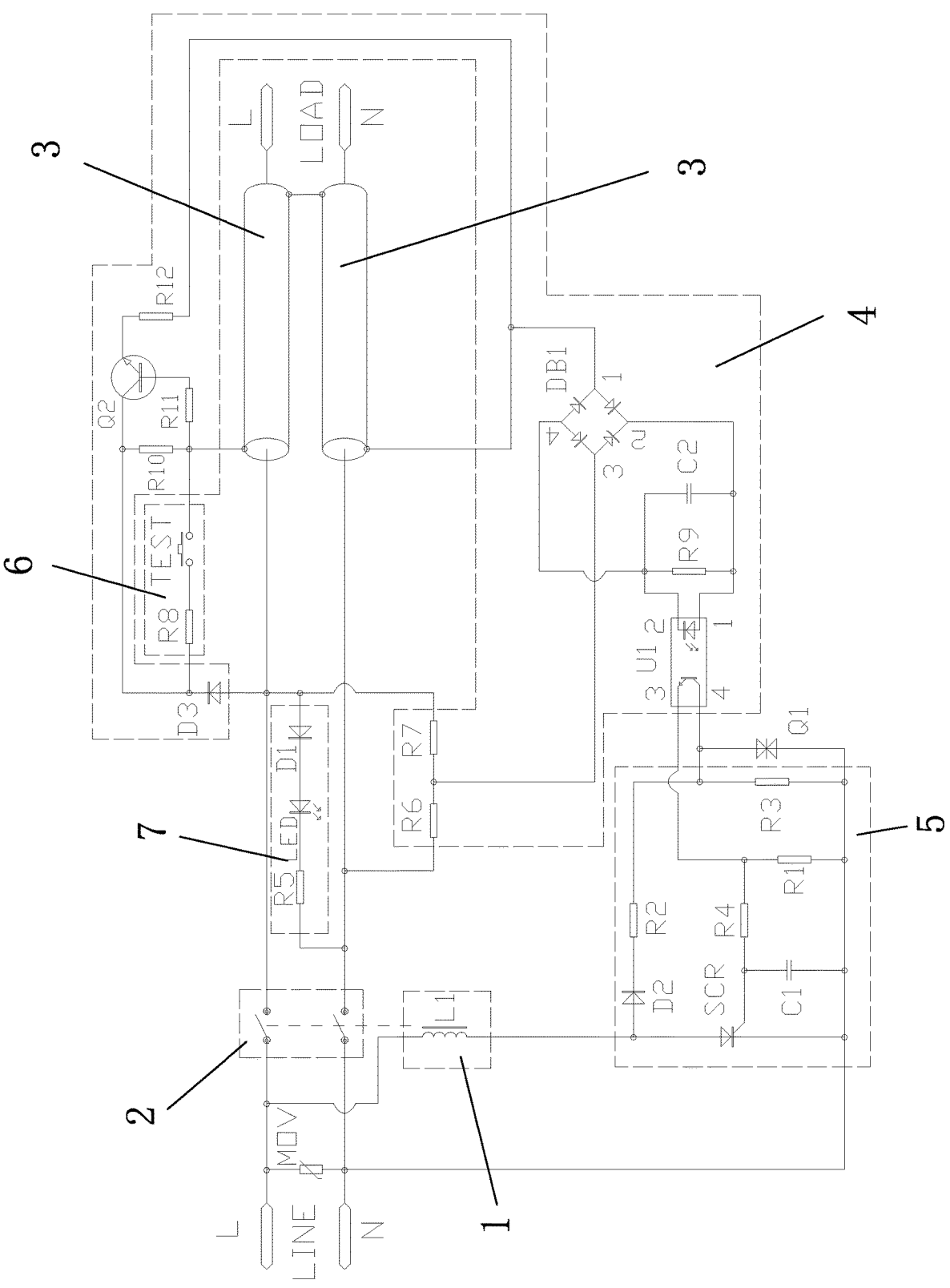

POWER CORD LEAKAGE DETECTION AND PROTECTION CIRCUIT

TECHNICAL FIELD

The present invention relates to a power cord leakage detection and protection circuit.

BACKGROUND ART

When the sheath of the power cord of the electrical appliance is broken due to accidental factors such as abrasion or animal bite in normal use, the wire core of the power cord will be exposed. When using, it is easy to occur that the live wire is short-circuited with the neutral wire, resulting in a fire accident. Therefore, in order to prevent the sheath of the power cord from being accidentally broken with the wire core exposed, a shielding layer protecting the wire core is generally wrapped on the outside of the power cord. However, the shielding layer cannot completely prevent the wire core of the power cord from being broken and exposed.

SUMMARY OF THE INVENTION

The present invention provides a power cord leakage detection and protection circuit to overcome the deficiencies of the prior art.

In order to achieve the above object, the present invention adopts the following technical solution.

A power cord leakage detection and protection circuit is characterized by including a live wire, a neutral wire and a tripping coil, wherein a controlled switch controlled by the tripping coil is respectively provided on the live wire and the neutral wire; a shielded wire is respectively provided outside the live wire and the neutral wire; tail ends of the two shielded wires are connected; a shielded wire detection circuit respectively connected to head ends of the two shielded wires is provided between the live wire and the neutral wire for detecting whether the shielded wire is cracked; and the shielded wire detection circuit is connected with a control circuit for controlling the tripping coil to disconnect the controlled switch when the shielded wire is detected to be cracked.

The power cord leakage detection and protection circuit as described above is characterized in that a test keying circuit for testing whether the shielded wire detection circuit is normal is provided between the live wire and the shielded wire detection circuit.

The power cord leakage detection and protection circuit as described above is characterized in that an indicator lamp circuit for indicating an operating state is provided between the live wire and the neutral wire.

The power cord leakage detection and protection circuit as described above is characterized in that an insulation layer is respectively provided outside the shielded wire of the live wire and outside the shielded wire of the neutral wire.

The power cord leakage detection and protection circuit as described above is characterized in that the shielded wire detection circuit includes a switch tube Q2, wherein a collector electrode of the switch tube Q2 is respectively connected to one end of a resistor R10 and a negative terminal of a diode D3; a base electrode of the switch tube Q2 is respectively connected to the other end of the resistor R10 and a head end of the shielded wire of the live wire via a resistor R11; an emitter electrode of the switch tube Q2 is respectively connected to a pin 1 of a rectifier bridge DB1 and the head end of the shielded wire of the live wire via a resistor R12; a positive terminal of the diode D3 is respectively connected to the live wire and one end of a resistor R7; the other end of the resistor R7 is respectively connected to a pin 3 of the rectifier bridge DB1 and one end of a resistor R6, and the other end of the resistor R6 is connected to the neutral wire; a pin 2 of the rectifier bridge DB1 is respectively connected to one end of a capacitor C2, one end of the resistor R9 and a pin 1 of a photoelectric coupler U1; a pin 4 of the rectifier bridge DB1 is respectively connected to the other end of the capacitor C2, the other end of the resistor R9 and a pin 2 of the photoelectric coupler U1; and pins 3 and 4 of the photoelectric coupler U1 are respectively connected to the control circuit.

The power cord leakage detection and protection circuit as described above is characterized in that the control circuit includes a silicon controlled SCR, wherein an anode terminal of the silicon controlled SCR is respectively connected to one end of the tripping coil and a positive terminal of the diode D2, and the other end of the tripping coil is connected to the live wire; a negative terminal of the diode D2 is respectively connected to the shielded wire detection circuit and one end of a resistor R3 via a resistor R2; a control end of the silicon controlled SCR is respectively connected to one end of the capacitor C1 and one end of a resistor R4, and the other end of the resistor R4 is respectively connected to the shielded wire detection circuit and the resistor R1; and a cathode terminal of the silicon controlled SCR, the other end of the resistor R3, the other end of the resistor R1 and the other end of the capacitor C1 are respectively connected to the neutral wire.

The power cord leakage detection and protection circuit as described above is characterized in that a resistor R3 is connected in parallel with a bidirectional transient suppression diode Q1 for overvoltage protection.

Advantageous effects of the present invention are as follows.

In the present invention, a shielded wire is wrapped around the outside of the live wire and the neutral wire, and the tail ends of the two shielded wires are short-circuited to form a path. A shielded wire detection circuit for detecting whether the shielded wire is cracked is provided between the head ends of the two shielded wires. After detecting that the shielded wire is cracked, the control circuit controls the tripping coil to work so as to switch off the controlled switch, thereby deenergizing the current leakage protection circuit, and preventing the wire core from being exposed after the shielded wire is broken and the short-circuiting between the live wire and the neutral wire to cause a fire accident.

BRIEF DESCRIPTION OF THE DRAWINGS

The sole FIGURE is a structurally schematic view of the present invention.

DETAILED DESCRIPTION OF THE INVENTION

The technical solutions of embodiments of the present invention will now be described more clearly and fully hereinafter with reference to the accompanying drawings.

It should be noted that all directivity indicators (such as up, down, left, right, front, rear, . . . ) in the embodiments of the present invention are only used to explain the relative positional relationship, motion, etc. between components at a particular pose (as shown in the drawings). If the particular pose is changed, the directivity indicator is changed accordingly. Furthermore, the description herein of "preferred", "less preferred", and the like is for descriptive purposes only and is not to be construed as indicating or implying a relative importance or implicitly indicating the number of technical features indicated. Thus, a feature defined as "preferred" or "less preferred" may explicitly or implicitly include at least one such feature.

As shown in The sole FIGURE, a power cord leakage detection and leakage protection circuit includes a live wire, a neutral wire and a tripping coil 1, wherein a controlled switch 2 controlled by the tripping coil 1 is respectively provided on the live wire and the neutral wire; a shielded wire 3 is respectively provided outside the live wire and the neutral wire; tail ends of the two shielded wires 3 are connected; a shielded wire detection circuit 4 respectively connected to head ends of the two shielded wires 3 is provided between the live wire and the neutral wire for detecting whether the shielded wire 3 is cracked; and the shielded wire detection circuit 4 is connected with a control circuit 5 for controlling the tripping coil 1 to disconnect the controlled switch 2 when the shielded wire 3 is detected to be cracked.

When in use, the controlled switch 2 is reset by pressing a reset key of a leakage protector, so that the leakage protector is electrified. During use, the shielded wire 3 is cracked under the action of an external force. At this time, the shielded wire detection circuit 4 sends a detection signal to the control circuit 5, and the control circuit 5 controls the tripping coil 1 to work, so that the controlled switch 2 is switched off, and the leakage protector is interrupted.

The outer side of the shielded wire 3 of the live wire and the outer side of the shielded wire 3 of the neutral wire are respectively provided with insulation layers, so as to prevent the shielded wires 3 of the two sides from contacting and short circuiting when the live wire and the neutral wire are arranged side by side, which cannot play the role of detecting the integrity of the shielded wires.

As shown in The sole FIGURE, an indicator lamp circuit 7 for indicating an operating state is provided between the live wire and the neutral wire. When the controlled switch 2 is reset by pressing a reset key and the leakage protector is energized, the indicator lamp LED emits light to indicate the operating state.

As shown in The sole FIGURE, the shielded wire detection circuit 4 includes a switch tube Q2, wherein a collector electrode of the switch tube Q2 is respectively connected to one end of a resistor R10 and a negative terminal of a diode D3; a base electrode of the switch tube Q2 is respectively connected to the other end of the resistor R10 and a head end of a shielded wire 3 of the live wire via a resistor R11; an emitter electrode of the switch tube Q2 is respectively connected to a pin 1 of a rectifier bridge DB1 and a head end of the shielded wire 3 of the live wire via a resistor R12; a positive terminal of the diode D3 is respectively connected to the live wire and one end of a resistor R7, and the other end of the resistor R7 is respectively connected to a pin 3 of the rectifier bridge DB1 and one end of a resistor R6, and the other end of the resistor R6 is connected to the neutral wire; a pin 2 of the rectifier bridge DB1 is respectively connected to one end of a capacitor C2, one end of the resistor R9 and a pin 1 of the photoelectric coupler U1; a pin 4 of the rectifier bridge DB1 is respectively connected to the other end of the capacitor C2, the other end of the resistor R9 and a pin 2 of the photoelectric coupler U1; and pins 3 and 4 of the photoelectric coupler U1 are respectively connected to the control circuit 5, wherein the switch tube Q2 is a switch triode, a MOS tube or a MOFSET, etc.

The control circuit 5 includes a silicon controlled SCR, wherein an anode terminal of the silicon controlled SCR is respectively connected to one end of the tripping coil 1 and a positive terminal of the diode D2, and the other end of the tripping coil 1 is connected to the live wire; a negative terminal of the diode D2 is respectively connected to the shielded wire detection circuit 4 and one end of a resistor R3 via a resistor R2; a control end of the silicon controlled SCR is respectively connected to one end of the capacitor C1 and one end of a resistor R4, and the other end of the resistor R4 is respectively connected to the shielded wire detection circuit 4 and the resistor R1; and a cathode terminal of the silicon controlled SCR, the other end of the resistor R3, the other end of the resistor R1 and the other end of the capacitor C1 are respectively connected to the neutral wire.

After the reset key of the leakage protector is pressed, the controlled switch 2 resets to make the leakage protector electrify. At this time, since the tail ends of the shielded wires 3 on the live wire side and the neutral wire side are short-circuited, the base electrode and the emitter electrode of the switch tube Q2 have a same voltage, and the switch tube Q2 is not conducted. When the shielded wire 3 on the live wire or neutral wire side is cracked, that is, the shielded wire 3 is cracked; at this moment, the base electrode of the switch tube Q2 is connected to the live wire to produce a high voltage, and the emitter electrode of the switch tube Q2 is connected to the neutral wire to produce a low voltage, so that the switch tube Q2 is conducted, and thus the rectifier bridge DB1 forms a path. At this moment, the pin 2 and the pin 4 of the rectifier bridge DB1 respectively output current to the pin 1 and the pin 2 of the photoelectric coupler U1. The pin 3 and the pin 4 of the photoelectric coupler U1 output power supply. A control signal is sent to a control end of the silicon controlled SCR, so that the silicon controlled SCR is conducted. Thus the tripping coil 1 is energized to work, and the controlled switch 2 is controlled to be switched off. Therefore, the leakage protector is powered off to realize the leakage protection function.

As shown in The sole FIGURE, a resistor R3 is connected in parallel with a bidirectional transient suppression diode Q1 for overvoltage protection, which is used for overvoltage protection to prevent circuit components from burning.

As shown in The sole FIGURE, a test keying circuit 6 for testing whether the shielded wire detection circuit 4 is normal is provided between the live wire and the shielded wire detection circuit 4, and the cracking of the shielded wire 3 is simulated by pressing a TEST key. At this moment, the base electrode of the switch tube Q2 is connected to the live wire to produce a high voltage, and the emitter electrode of the switch tube Q2 is connected to the neutral wire to produce a low voltage, so that the switch tube Q2 is conducted. The working principle is the same as the working principle after the above-mentioned shielded wire 3 is cracked.

The foregoing are only preferred embodiments of the invention and do not limit the patent scope of the invention. Any equivalent structural transformation made by using the description and accompanying drawings of the invention under the invention idea of the invention, or the content directly or indirectly applied in other related technical fields, shall be included in the patent protection scope of the invention.

The invention claimed is:

1. A power cord leakage detection and protection circuit is characterized by including a live wire, a neutral wire and a tripping coil, wherein a controlled switch controlled by the tripping coil is respectively provided on the live wire and the neutral wire; a shielded wire is respectively provided outside the live wire and the neutral wire; tail ends of the two shielded wires are connected; a shielded wire detection circuit respectively connected to head ends of the two shielded wires is provided between the live wire and the neutral wire for detecting whether the shielded wire is cracked; and the shielded wire detection circuit is connected with a control circuit for controlling the tripping coil to disconnect the controlled switch when the shielded wire is detected to be cracked;

wherein the shielded wire detection circuit includes a switch tube Q2, wherein a collector electrode of the switch tube Q2 is respectively connected to one end of a resistor R10 and a negative terminal of a diode D3; a base electrode of the switch tube Q2 is respectively connected to the other end of the resistor R10 and a head end of the shielded wire of the live wire via a resistor R11; an emitter electrode of the switch tube Q2 is respectively connected to a pin 1 of a rectifier bridge DB1 and the head end of the shielded wire of the live wire via a resistor R12; a positive terminal of the diode D3 is respectively connected to the live wire and one end of a resistor R7; the other end of the resistor R7 is respectively connected to a pin 3 of the rectifier bridge DB1 and one end of a resistor R6, and the other end of the resistor R6 is connected to the neutral wire; a pin 2 of the rectifier bridge DB1 is respectively connected to one end of a capacitor C2, one end of the resistor R9 and a pin 1 of a photoelectric coupler U1; a pin 4 of the rectifier bridge DB1 is respectively connected to the other end of the capacitor C2, the other end of the resistor R9 and a pin 2 of the photoelectric coupler U1; and pins 3 and 4 of the photoelectric coupler U1 are respectively connected to the control circuit.

2. The power cord leakage detection and protection circuit according to claim 1, wherein a test keying circuit for testing whether the shielded wire detection circuit is normal is provided between the live wire and the shielded wire detection circuit.

3. The power cord leakage detection and protection circuit according to claim 1, wherein an indicator lamp circuit for indicating an operating state is provided between the live wire and the neutral wire.

4. The power cord leakage detection and protection circuit according to claim 1, wherein an insulation layer is respectively provided outside the shielded wire of the live wire and outside the shielded wire of the neutral wire.

5. The power cord leakage detection and protection circuit according to claim 1, wherein the control circuit includes a silicon controlled SCR, wherein an anode terminal of the silicon controlled SCR is respectively connected to one end of the tripping coil and a positive terminal of the diode D2, and the other end of the tripping coil is connected to the live wire; a negative terminal of the diode D2 is respectively connected to the shielded wire detection circuit and one end of a resistor R3 via a resistor R2; a control end of the silicon controlled SCR is respectively connected to one end of the capacitor C1 and one end of a resistor R4, and the other end of the resistor R4 is respectively connected to the shielded wire detection circuit and the resistor R1; and a cathode terminal of the silicon controlled SCR, the other end of the resistor R3, the other end of the resistor R1 and the other end of the capacitor C1 are respectively connected to the neutral wire.

6. The power cord leakage detection and protection circuit according to claim 5, wherein a resistor R3 is connected in parallel with a bidirectional transient suppression diode Q1 for overvoltage protection.

* * * * *